United States Patent
Benedix et al.

(10) Patent No.: US 6,590,824 B2
(45) Date of Patent: Jul. 8, 2003

(54) DYNAMIC SEMICONDUCTOR MEMORY WITH REFRESH AND METHOD FOR OPERATING SUCH A MEMORY

(75) Inventors: Alexander Benedix, München (DE); Reinhard Düregger, Poing (DE); Robert Hermann, Altomünster (DE); Roland Barth, San Jose, CA (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/112,521

(22) Filed: Mar. 28, 2002

(65) Prior Publication Data

US 2002/0141272 A1 Oct. 3, 2002

(30) Foreign Application Priority Data

Mar. 28, 2001 (DE) .......................... 101 15 291
Jun. 19, 2001 (DE) .......................... 101 29 315

(51) Int. Cl.[7] .............................................. G11C 7/00
(52) U.S. Cl. .............. 365/222; 365/230.03; 365/230.06
(58) Field of Search ............................ 365/222, 230.03, 365/230.06

(56) References Cited

U.S. PATENT DOCUMENTS

| | | | | |
|---|---|---|---|---|
| 5,577,223 A | * | 11/1996 | Tanoi et al. | ........... 365/230.03 |
| 5,774,409 A | * | 6/1998 | Yamazaki et al. | ..... 365/230.03 |
| 6,175,535 B1 | | 1/2001 | Dhong et al. | |
| 6,212,118 B1 | * | 4/2001 | Fujita | .......................... 365/222 |

* cited by examiner

*Primary Examiner*—Huan Hoang
(74) *Attorney, Agent, or Firm*—Laurence A. Greenberg; Werner H. Stemer; Ralph E. Locher

(57) ABSTRACT

A dynamic semiconductor memory and a method for operating such a memory includes memory banks with memory cells disposed in rows, and registers associated with the memory banks for storing an address of an open, activated word line. In the event of an external refresh command, a control device causes, after the refresh operation, the state of the memory banks to be reestablished, in particular, the word line whose address was stored in the register to be reactivated. Such a purely on-chip measure increases the operating speed of the memory.

14 Claims, 1 Drawing Sheet

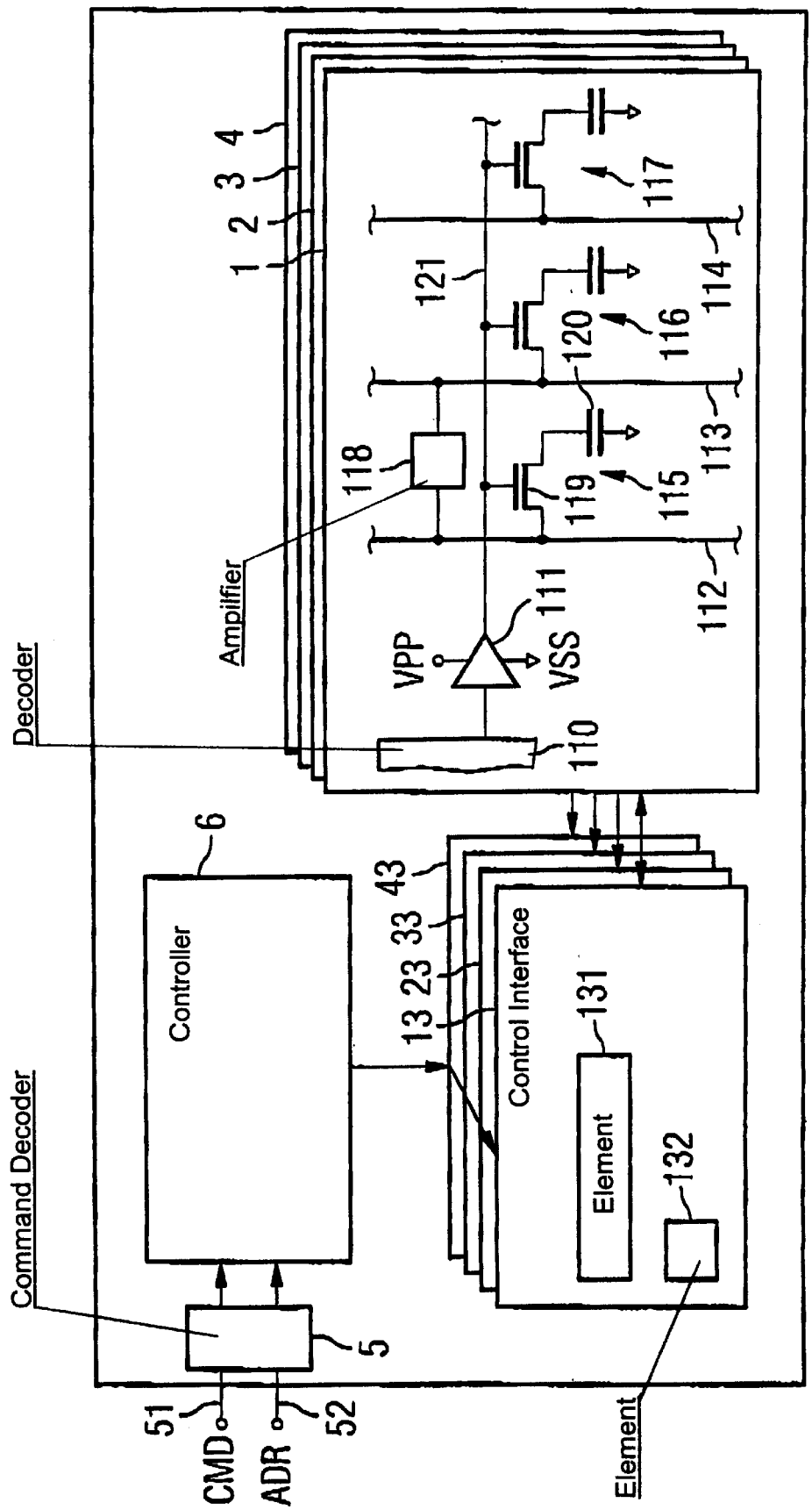

DYNAMIC SEMICONDUCTOR MEMORY WITH REFRESH AND METHOD FOR OPERATING SUCH A MEMORY

BACKGROUND OF THE INVENTION

Field of the Invention

The invention lies in the field of integrated circuits. The invention relates to a semiconductor memory having at least one memory bank including dynamic memory cells. The memory cells are disposed in rows and are addressable through a word line. When a memory cell is accessed, the respective word line is activated. A control device provides for a refresh operation. The invention additionally relates to a method for operating such a semiconductor memory.

Dynamic semiconductor memories contain memory cells that conventionally include a selection transistor and also a storage capacitor. The memory cells are disposed in a plurality of memory banks. A memory bank contains all the functional units for performing an access to a memory cell. The memory banks can be operated independently of one another. Within a memory bank, the memory cells are disposed in rows. All the memory cells of a row are addressable by a word line. When the word line is activated, the selection transistors of the memory cell are turned on so that the storage capacitor is respectively connected to a bit line. The stored data value is available on the bit line ready for read-out after amplification by a sense amplifier.

Unavoidable leakage currents in the semiconductor chip reduce the quantity of charge that is stored in the storage capacitor and represents either a logic "1" or a logic "0". The charge content of the memory cell must, therefore, be refreshed from time to time. The refresh interval is typically 64 milliseconds. During the refresh operation, for all the word lines and the memory cells of a memory bank that are connected thereto, in each case after the activation of the word line, the data content of the memory cells is amplified in the sense amplifier. Afterward, the amplified level is written back to the memory cell. Finally, the word line is deactivated, so that the selection transistors of the memory cells connected thereto are turned off.

In system applications with dynamic semiconductor memories, for example, in the case of personal computers, a memory controller is provided as a separate semiconductor chip to control the accesses to the dynamic semiconductor memory. Conventional memory controllers store the address of the respectively open row for one of the open memory banks of an addressed semiconductor memory. Because, during the processing of programs or data stored in the semiconductor memory, it can be assumed with high probability that subsequent memory accesses are made to successive memory addresses and, hence, adjacent memory cells, it is possible, due to the buffer-storage of the address of the already activated row of a memory bank, in principle, to accelerate the access to the memory bank.

In today's system applications, however, endeavors are made to the effect that, in the event of a read access to the semiconductor memory, usually relatively large data blocks are read out and buffer-stored in a fast buffer memory, a so-called cache memory. By way of example, a sufficiently short loop of an operating program is loaded completely from the dynamic semiconductor memory into the cache memory, which is significantly faster by comparison, and is multiply iterated. Even if the subsequent access to the dynamic semiconductor memory is effected compared with a preceding access to adjacent memory cells that are spatially close together, so much time has already elapsed through the processing of the program loop of the main memory that a refresh operation has been necessary in the meantime. Because all the word lines are run through during the refresh operation, without further measures, the information about the activated word line that was previously ready for access is no longer present on the semiconductor memory. If the memory controller has stored the address of the previously activated word line, the address must be retransmitted to the semiconductor memory to reactivate there the row that was activated before the refresh operation. Such is true because, in accordance with the specification for synchronously operating dynamic semiconductor memories, so-called SDRAMs, before a refresh command can be applied to the SDRAM, all the memory banks must be put into the precharged state, the so-called precharge all state, so that all the word lines are deactivated and set to reference-ground potential. Only if the memory controller has corresponding registers in which the address of the activated row has been buffer-stored and transmits the address with a corresponding activate command after a refresh operation for the relevant memory bank to the dynamic semiconductor memory is such a memory bank, and, therein, the relevant row or word line, then activated. On one hand, the process has the disadvantage that the access speed is reduced because, on the semiconductor memory itself, the information about the open row is lost due to the refresh operation and the information has to be retransmitted from the memory controller after the refresh operation. On the other hand, additional data traffic is generated that burdens the memory bus in the system and, therefore, also impairs the operating speed.

SUMMARY OF THE INVENTION

It is accordingly an object of the invention to provide a dynamic semiconductor memory with refresh that overcomes the hereinafore-mentioned disadvantages of the heretofore-known devices and methods of this general type and that improves a dynamic semiconductor memory of the type mentioned in the introduction to the effect memory accesses faster, in particular, the intention is that a refresh operation will not impair the access readiness of the dynamic semiconductor memory more than necessary.

With the foregoing and other objects in view, there is provided, in accordance with the invention, a semiconductor memory including at least one memory bank having dynamic memory cells disposed in rows and word lines, the memory cells of one of the rows being connected to and addressed by one of the word lines, the one word line being activated for access of one of the memory cells connected to the one word line, a memory element connected to the memory bank and storing an address associated with an activated one of the word lines, and a control device connected to the memory bank, the control device programmed to refresh the memory bank by resetting all of the word lines of the memory bank and to activate one of the word lines having the address stored in the memory element after refreshing the memory bank.

With the objects of the invention in view, there is also provided a method for operating a semiconductor memory including the steps of providing at least one memory bank having dynamic memory cells disposed in rows, addressing the memory cells of a row through a word line and accessing a memory cell by activating the word line connected to the memory cell, storing an address of an activated word line of the memory bank, refreshing the charge content of all the memory cells of the memory bank, and after the refresh, activating again the word line within the memory bank associated with the stored address.

In accordance with another mode of the invention, a first state of an identifier associated with the memory bank is stored if a word line has been activated in the memory bank and a second state of the identifier is stored if no word line is activated in the memory bank, and after the refresh, the word line associated with the stored address is activated and the identifier is set from the second state to the first state.

In the case of the dynamic semiconductor memory according to the invention, a memory element, expediently a register, is provided on the semiconductor memory itself, in a manner associated with each memory bank to buffer-store that address assigned to the currently activated word line. In principle, it suffices if the address of the activated memory cell is buffer-stored only before a refresh operation. Previously, such information was, at most, buffer-stored in the memory controller. During the refresh, the control device that controls the refresh operation resets all the word lines of a memory bank in order subsequently to automatically activate once again that word line whose address is stored in the register provided therefor. Furthermore, it is expedient to provide a further memory element, expediently as a one-bit register, assigned to a respective memory bank, the activation state of the assigned memory bank being stored in the memory element.

In the event of a refresh command applied externally to the semiconductor memory, in all the memory banks, the word lines are deactivated and pulled to reference-ground potential (command: precharge all). Afterward, the refresh operation is performed for all the memory banks, as explained in the introduction, the procedure being that, in each memory bank, the memory cells of all the rows are in each case read in rows, amplified, and written back again. Following is a reestablishment of the bank state from before the refresh operation for all the memory banks. This means that where the so-called open bit of the second memory element assigned to a memory bank was set, the bank as such is activated and, moreover, that row whose address was stored in the first memory element assigned to the memory bank is activated (command: activate all with reestablishment of the memory state). The functionality for each memory bank thus includes the following: with an activate command directed to the bank, the row address is stored in the first memory element and the open bit is set. The bank is now characterized as activated, as is a row within the bank. The open bit is reset with a precharge command. The address of the previously activated memory cell still remains stored in the first memory element and can be activated again with the next activate command. Compared with the conventional solution incorporating the memory controller, no additional data traffic is generated on the memory bus. The on-chip buffer-storage of the open bit and of the address of the row activated last provides for further automatic and fast reestablishment of the bank state present before the refresh operation.

In accordance with a further feature of the invention, there is provided a second memory element connected to the memory bank and storing data indicating a state of an open word line within the memory bank. The control device is programmed to activate, after refresh, one of the word lines having the address stored in the memory element and to set the state in the second memory element.

In accordance with an added feature of the invention, the control device is programmed, dependent upon a control command applied externally to the semiconductor memory, first to deactivate all of the word lines in the memory bank, then to carry out a refresh for all of the memory cells of the memory bank, and then to activate one of the word lines having the address stored in the memory element.

In accordance with an additional feature of the invention, the memory cells each have a selection transistor with a controlled path and a control terminal and a capacitor connected to the controlled path, and the control terminal is coupled to one of the word lines.

In accordance with yet another feature of the invention, there is provided a word line driver having an output side. The output side is coupled to one of the word lines and the word line driver supplies an activated word line with a high level and a non-activated word line with a low level. Preferably, the low level is a reference-ground potential.

The activation of a word line means that the level thereof is raised until the selection transistors of the memory cells connected thereto are completely turned on. The level usually still lies above the supply voltage that is fed in externally, and is generated by a voltage pump. As a result, the storage capacitors of the memory cells disposed within a row are connected to a respective bit line through the completely turned-on selection transistor. A non-activated word line is connected to reference-ground potential. Reference-ground potential is usually ground. In other applications, the deactivated word line may also be connected to a negative potential to ensure that the selection transistors of the row are completely turned off.

In accordance with yet a further feature of the invention, the at least one memory bank is a plurality of memory banks including a second memory bank, the second memory bank has dynamic memory cells disposed in rows and word lines, the memory cells of a row are connected to and addressed by one of the word lines, the one word line being activated for access of one of the memory cells connected to the one word line, a second memory element is connected to the second memory bank and stores an address associated with an activated one of the word lines, and the control device is programmed to refresh one of the memory banks by resetting all of the word lines of the one memory bank and to activate one of the word lines of the one memory bank having the address stored in the memory element after refreshing the one memory bank.

Depending on the architecture of the semiconductor memory, the memory may have a single memory bank, the memory bank being assigned the register for buffer-storing the address of the currently activated word line. Finally, there are semiconductor memories in which a plurality of memory banks are provided, for example, two or four or even more memory banks. It is then expedient for each of the memory banks to be assigned such a register mentioned above to store there the address of the currently activated word line or the address of the currently open row. In such a case, a memory bank is a unit that is autonomously functional independently of the other memory banks. A memory bank contains an address decoder to select memory cells through activation of word lines and selection of bit lines. The decoders assigned to a memory bank select only word lines and bit lines within the memory bank. Other decoders that operate independently of the first-mentioned decoder are necessary for word lines and bit lines of other memory banks. If a bank is open, i.e., a word line or row of the bank is activated, then, prompted by the opening of the bank and activation of the word line or row, the address of the row assigned to the bank is buffer-stored in the register according to the invention. During a refresh operation, all the rows of the bank are closed and put into the so-called idle state. The invention for the first time makes it possible that, after a refresh operation, the previously open row or word line is opened without the need for an external address transmission.

With the objects of the invention in view, there is also provided a method for operating a semiconductor memory including the steps of providing at least one memory bank having dynamic memory cells disposed in rows, connecting a memory element to the memory bank, addressing the memory cells of a row through a word line and accessing a memory cell by activating the word line connected to the memory cell, storing an address associated with an activated word line in the memory element, refreshing the memory bank with a control device by resetting all word lines of the memory bank, and activating a word line having the address stored in the memory element after the refresh.

In accordance with yet an added mode of the invention, data indicating a state of an open word line is stored within the memory bank in a second memory element connected to the memory bank, and after refresh, one of the word lines having the address stored in the memory element is activated with the control device and the state in the second memory element is set.

In accordance with yet an additional mode of the invention, dependent upon a control command applied externally to the semiconductor memory, the control device first deactivates all of the word lines in the memory bank, then refreshes all of the memory cells of the memory bank, and then activates one of the word lines having the address stored in the memory element.

In accordance with again another mode of the invention, an output side of a word line driver is connected to a word line and a high level is supplied to the word line if the word line activated and a low level is supplied to the word line if the word line is non-activated.

In accordance with a concomitant mode of the invention, there is provided a plurality of memory banks including a second memory bank having word lines and dynamic memory cells disposed in rows. A second memory element is connected to the second memory bank. The memory cells of a row are addressed through a word line and one of the memory cells is accessed by activating the word line connected to the memory cell. An address associated with an activated one of the word lines is stored in the second memory element. One of the memory banks is refreshed by resetting all of the word lines of the one memory bank. One of the word lines of the one memory bank having the address stored in the second memory element is activated after refreshing the one memory bank.

Other features that are considered as characteristic for the invention are set forth in the appended claims.

Although the invention is illustrated and described herein as embodied in a dynamic semiconductor memory with refresh, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

The FIGURE is a block and fragmentary schematic circuit diagram of a detail with functional units of a dynamic semiconductor memory (DRAM) according to the invention.

DESCRIPTION OF THE PREFERRED EMBODIMENTS

Referring now to the single FIGURE of the drawing, it is seen that a DRAM has four memory banks 1, 2, 3, 4. Each of the memory banks contains a multiplicity of memory cells with all the addressing logic that enables the memory banks to operate independently of one another. Thus, illustrated by way of example, the memory bank 1 has three memory cells 115, 116, 117. These memory cells 115, 116, 117 are disposed in a row of the memory bank 1 and are all connected to the same word line 121. The word line 121 may either physically be a single line or include a plurality of segments and be regarded logically as a word line. Each of the memory cells is constructed identically. By way of example, the memory cell 115 includes a selection transistor 119, which can be driven by the word line 121 on the gate side and is connected to a storage capacitor 120 at one of the terminals of the controlled current path. The storage capacitor 120 stores a quantity of charge corresponding either to a logic "1" or to a logic "0". The other terminal of the controlled path of the selection transistor 119 is connected to a bit line 112. For accessing the memory cell 115, the word line 121 is activated, so that the selection transistor 119 is turned on and connects the capacitor 120 to the bit line 112. A sense amplifier 118 amplifies the relatively small level change on the bit line 112. With such an activation of the word line 121, the data in all the memory cells connected to the word line are kept ready in an amplified manner in sense amplifiers.

Leakage currents cause the quantity of charge stored in the storage capacitor 120 to be reduced over the course of time. Therefore, a refresh operation must be carried out, it being standard practice to do so about every 64 milliseconds, in that, for all the memory cells of the memory bank 1, one after the other, the respective word lines are activated, the data values output from the memory cells onto the bit lines are amplified in associated sense amplifiers and are subsequently written back to the memory cells so that finally the word line is deactivated again and the same refresh operation is applied to the next row. The word line 121 is driven by a word line driver 111, which outputs either the activation potential VPP or reference-ground potential (ground) VSS. For its part, the word line driver 111 is driven by a row decoder 110, which activates one of the multiplicity of word lines in a manner dependent on a row address fed thereto. The memory cell array includes further word lines running parallel to the word line and the row of memory cells 115, 116, 117, as well as further bit lines running parallel to the bit lines 112, 113, 114 illustrated. The other memory banks are constructed correspondingly to provide the same functionality.

Commands CMD and addresses ADR are fed to the semiconductor memory externally through external terminals 51, 52. A command decoder 5 decodes the commands and causes a control device 6 to supply the affected functional units in the semiconductor memory with control signals such that the externally applied, decoded command is processed. By way of example, the control device 6 generates corresponding control signals to perform read or write inquiries. The environment when executing an externally applied refresh command is of interest here. The control device 6 is connected to respective control interfaces 13, 23, 33, 43 assigned to the memory banks 1, 2, 3, 4. Each of the interfaces, for example, the interface 13 assigned to the memory bank 1, has two memory elements.

A first memory element or register 131 serves for storing the address of the currently open or activated word line in the memory bank, e.g., the address of the word line 121. A second memory element or register 132 stores whether the memory bank 1 is open or not open. One of the word lines is activated during the open state; all the word lines within the memory bank are deactivated during the closed state. The former state is referred to as the activate state and the latter state is referred to as the precharge state. The register 132 stores the so-called open bit. By way of example, if the word line 121 is activated in the memory bank 1 and the associated sense amplifiers keep the data values of the memory cells 115, 116, 117 ready for an access, then such a state is signaled by a set open bit in the memory element 132 in the interface 13, the address of the word line 121 additionally being stored in the register 131. The address serves, in the row decoder 110, for forwarding the high word line potential VPP to the word line 121 through the driver 111.

An externally initiated refresh operation proceeds as follows, using the functional units described. The refresh request is communicated to the semiconductor memory through the terminals 51, 52 and decoded in the command decoder 5. The command decoder 5 instructs the control device 6 firstly to send the control signals for a precharge all command. All the word lines in all the memory banks 1, 2, 3, 4 are then brought to the precharge state, i.e., connected to reference-ground potential VSS. The open bit respectively assigned to the memory banks, e.g., stored in the register 132 for the memory bank 1, is reset. The address of the word line of the respective memory banks that was open directly before the application of the refresh request is already stored or is stored on the occasion of the precharge all command, for example, in the register 131 for the memory bank 1. In a second step of the refresh request, the actual refresh is then carried out within all the memory banks due to the control commands sent by the control device 6. Finally, the control device 6 sends the control sequence for an activate all command with reestablishment of the respective bank state. This means that, for all the banks, the open bit is again set and that word line whose address is stored in the corresponding register, for example, in the register 131 for the memory bank 1, is automatically activated again within the bank.

The precharge all/refresh/activate all commands are fed in the form of respective control signals in parallel to the interface devices 13, 23, 33, 43.

The circuit and control measures described ensure that the bank states present before a refresh are reestablished automatically after a refresh by purely internal measures of the semiconductor memory. Such a configuration has the advantage that a row of a bank is already activated and immediately available for a further memory access. This is based on the experience that a renewed memory access is again effected, with high probability, to the same cell at adjacent memory cells compared with the previous memory access. The operating speed of the overall system is increased by these measures. The bank state information on the semiconductor memory chip itself is no longer lost through a refresh operation.

We claim:

1. A semiconductor memory, comprising:
   at least one memory bank having:
      dynamic memory cells disposed in rows; and
      word lines;
   said memory cells of one of said rows connected to and addressed by one of said word lines, said one word line being activated for access of one of said memory cells connected to said one word line;
   a memory element connected to said memory bank and storing an address associated with an activated one of said word lines; and
   a control device connected to said memory bank, said control device programmed:
      to refresh said memory bank by resetting all of said word lines of said memory bank; and
      to activate one of said word lines having the address stored in said memory element after refreshing said memory bank.

2. The semiconductor memory according to claim 1, including a second memory element connected to said memory bank and storing data indicating a state of an open word line within said memory bank, said control device being programmed:
   to activate, after refresh, one of said word lines having the address stored in said memory element; and
   to set said state in said second memory element.

3. The semiconductor memory according to claim 1, wherein said control device is programmed, dependent upon a control command applied externally to the semiconductor memory:
   first to deactivate all of said word lines in said memory bank;
   then to carry out a refresh for all of said memory cells of said memory bank; and
   then to activate one of said word lines having the address stored in said memory element.

4. The semiconductor memory according to claim 1, wherein:
   said memory cells each have:
      a selection transistor with a controlled path and a control terminal; and
      a capacitor connected to said controlled path; and
   said control terminal is coupled to one of said word lines.

5. The semiconductor memory according to claim 1, including a word line driver having an output side, said output side coupled to one of said word lines, said word line driver supplying an activated word line with a high level and a non-activated word line with a low level.

6. The semiconductor memory according to claim 5, wherein the low level is a reference-ground potential.

7. The semiconductor memory according to claim 1, wherein:
   said memory bank is a plurality of memory banks including a second memory bank;
   said second memory bank has:
      dynamic memory cells disposed in rows; and
      word lines;
   said memory cells of a row of said second memory bank are connected to and addressed by one of said word lines of said second memory bank, said one word line being activated for access of one of said memory cells connected to said one word line;
   a second memory element is connected to said second memory bank and stores an address associated with an activated one of said word lines of said second memory bank; and
   said control device is programmed:
      to refresh one of said memory banks by resetting all of said word lines of said one memory bank; and
      to activate one of said word lines of said one memory bank having the address stored in said memory element after refreshing said one memory bank.

8. A method for operating a semiconductor memory, which comprises:

providing at least one memory bank having dynamic memory cells disposed in rows;

addressing the memory cells of a row through a word line and accessing a memory cell by activating the word line connected to the memory cell;

storing an address of an activated word line of the memory bank;

refreshing the charge content of all the memory cells of the memory bank; and after the refresh, activating again the word line within the memory bank associated with the stored address.

9. The method according to claim 8, which further comprises:

storing a first state of an identifier associated with the memory bank if a word line has been activated in the memory bank and storing a second state of the identifier if no word line is activated in the memory bank; and after the refresh, activating the word line associated with the stored address and setting the identifier from the second state to the first state.

10. A method for operating a semiconductor memory, which comprises:

providing at least one memory bank having dynamic memory cells disposed in rows;

connecting a memory element to the memory bank;

addressing the memory cells of a row through a word line and accessing a memory cell by activating the word line connected to the memory cell;

storing an address associated with an activated word line in the memory element;

refreshing the memory bank with a control device by resetting all word lines of the memory bank; and activating a word line having the address stored in the memory element after the refresh.

11. The method according to claim 10, which further comprises:

storing data indicating a state of an open word line within the memory bank in a second memory element connected to the memory bank; and after refresh, activating one of the word lines having the address stored in the memory element with the control device and setting the state in the second memory element.

12. The method according to claim 10, which further comprises, dependent upon a control command applied externally to the semiconductor memory, first deactivating all of the word lines in the memory bank with the control device, then refreshing all of the memory cells of the memory bank with the control device, and then activating one of the word lines having the address stored in the memory element with the control device.

13. The semiconductor memory according to claim 10, which further comprises:

connecting an output side of a word line driver to a word line; and supplying a high level to the word line if activated and a low level to the word line if non-activated.

14. The semiconductor memory according to claim 10, which further comprises:

providing a plurality of memory banks including a second memory bank having word lines and dynamic memory cells disposed in rows;

connecting a second memory element to the second memory bank;

addressing the memory cells of a row of the second memory bank through a word line of the second memory bank and accessing one of the memory cells of the second memory bank by activating the word line of the second memory bank connected to the memory cell;

storing an address associated with an activated one of the word lines in the second memory element; and refreshing one of the memory banks by resetting all of the word lines of the one memory bank, and activating one of the word lines of the one memory bank having the address stored in the second memory element after refreshing the one memory bank.

* * * * *